US011892534B2

United States Patent
Hamachi

(10) Patent No.: US 11,892,534 B2
(45) Date of Patent: Feb. 6, 2024

(54) FREQUENCY CHARACTERISTIC MEASUREMENT APPARATUS

(71) Applicant: ROHM Co., LTD., Kyoto (JP)

(72) Inventor: Kenji Hamachi, Kyoto (JP)

(73) Assignee: ROHM Co., LTD., Kyoto (JP)

(*) Notice: Subject to any disclaimer, the term of this patent is extended or adjusted under 35 U.S.C. 154(b) by 23 days.

(21) Appl. No.: 17/655,880

(22) Filed: Mar. 22, 2022

(65) Prior Publication Data

US 2022/0317226 A1     Oct. 6, 2022

(30) Foreign Application Priority Data

Apr. 6, 2021 (JP) ................................. 2021-064762
Jan. 12, 2022 (JP) ................................. 2022-002730

(51) Int. Cl.
    *G01R 35/00*         (2006.01)
    *G01R 23/02*         (2006.01)

(52) U.S. Cl.
    CPC ........... *G01R 35/005* (2013.01); *G01R 23/02* (2013.01)

(58) Field of Classification Search
    CPC ........ G01R 23/02; G01R 35/005; G01R 1/00; G01R 3/00; G01R 5/00; G01R 7/00; G01R 9/00; G01R 11/00; G01R 13/00; G01R 15/00; G01R 17/00; G01R 19/00; G01R 21/00; G01R 22/00; G01R 23/00; G01R 25/00; G01R 27/00; G01R 29/00; G01R 31/00; G01R 33/00; G01R 35/00
    See application file for complete search history.

(56) References Cited

U.S. PATENT DOCUMENTS

2004/0051538 A1*   3/2004   Adamian ............. G01R 35/005
                                                                  324/601
2015/0097575 A1*   4/2015   Hiraga ................. G01R 31/002
                                                                  324/537

* cited by examiner

*Primary Examiner* — Feba Pothen
*Assistant Examiner* — Brent J Andrews
(74) *Attorney, Agent, or Firm* — CHIP LAW GROUP

(57) ABSTRACT

A frequency characteristic measurement apparatus includes a calibration circuit configured to perform a SOLT calibration on cable end surfaces, a first measurement circuit measuring S-parameters of a first substrate provided with a DUT, after the SOLT calibration by the calibration circuit, a second measurement circuit measuring S-parameters of a second substrate after the SOLT calibration by the calibration circuit, and an extraction circuit performing a vector operation of a measurement result of the first measurement circuit and a measurement result of the second measurement circuit to extract S-parameters of the DUT. The extraction circuit assumes that a reflection of each of first second fixtures obtained by virtually dividing the second substrate into two parts at the center, on an end surface of the second substrate is equal to or smaller than a reflection on an end surface of the second substrate without the virtual division at the center.

6 Claims, 4 Drawing Sheets

FREQUENCY CHARACTERISTIC MEASUREMENT APPARATUS

CROSS REFERENCE TO RELATED APPLICATIONS

This application claims priority benefit of Japanese Patent Application No. JP 2021-64762 filed in the Japan Patent Office on Apr. 6, 2021, and JP 2022-002730 filed in the Japan Patent Office on Jan. 12, 2022. Each of the above-referenced applications is hereby incorporated herein by reference in its entirety.

BACKGROUND

The disclosure disclosed in the present specification relates to a technique of measuring frequency characteristics of a device under test (DUT).

A frequency characteristic measurement apparatus, such as a vector network analyzer, measures frequency characteristics of a DUT. In a conventional general measurement method, a short-open-load-thru (SOLT) calibration disclosed in Kotomi Ichikawa and Yuichi Ichikawa, "Detailed explanation of S-parameters for high frequency circuit design," fifth edition, CQ publishing Co., Ltd., Jan. 1, 2020, pp. 14 to 143 is carried out first on cable end surfaces. A short substrate prepared in place of the DUT, an open substrate prepared in place of the DUT, a substrate with a load prepared in place of the DUT, and a thru substrate in which the part provided with the DUT is removed from a sample substrate provided with the DUT are sequentially attached between cables to carry out the SOLT calibration. Subsequently, S-parameters of only the DUT are extracted from measurement results of S-parameters of the sample substrate provided with the DUT. As a result, pure frequency characteristics of the DUT can be obtained.

However, the conventional general measurement method requires four types of substrates for calibration. As a result, a large amount of cost is necessary for the substrates for calibration, and the calibration operation requires much time.

SUMMARY

A frequency characteristic measurement apparatus disclosed in the present specification includes a calibration unit configured to perform a SOLT calibration on cable end surfaces, a first measurement unit configured to measure S-parameters of a first substrate provided with a DUT, after the SOLT calibration by the calibration unit, a second measurement unit configured to measure S-parameters of a second substrate after the SOLT calibration by the calibration unit, and an extraction unit configured to perform a vector operation of a measurement result of the first measurement unit and a measurement result of the second measurement unit to extract S-parameters of the DUT, in which the extraction unit assumes that a reflection of each of a first fixture and a second fixture, which are obtained by virtually dividing the second substrate into two parts at the center, on an end surface of the second substrate is equal to or smaller than a reflection on an end surface of the second substrate without the virtual division at the center, the first substrate includes at least one connector on each of a first end surface and a second end surface, the second substrate has a structure in which a part provided with the DUT is removed from the first substrate and two optional connectors are selected from among all of the connectors installed on the first substrate to form a through-connection, and the number of second substrates is a total number of combinations of selecting two connectors from among all of the connectors installed on the first substrate (first configuration).

In the frequency characteristic measurement apparatus according to the first configuration, the extraction unit may set an amplitude of the S-parameter indicating the reflection of the first fixture on the end surface of the second substrate to a single first fixed value throughout an entire frequency range of a measurement range, set a phase of the S-parameter indicating the reflection of the first fixture on the end surface of the second substrate to zero throughout the entire frequency range of the measurement range, set an amplitude of the S-parameter indicating the reflection of the second fixture on the end surface of the second substrate to the first fixed value throughout the entire frequency range of the measurement range, and set a phase of the S-parameter indicating the reflection of the second fixture on the end surface of the second substrate to zero throughout the entire frequency range of the measurement range (second configuration).

In the frequency characteristic measurement apparatus according to the first or second configuration, the extraction unit may assume that transmission characteristics of the first fixture and transmission characteristics of the second fixture are symmetrical (third configuration).

In the frequency characteristic measurement apparatus according to the first or second configuration, the extraction unit may not assume that transmission characteristics of the first fixture and transmission characteristics of the second fixture are symmetrical (fourth configuration).

In the frequency characteristic measurement apparatus according to any one of the first to fourth configurations, a distance between two end surfaces to be connected to cables of the second substrate may be less than twice a reciprocal of a lowest frequency of the measurement range (fifth configuration).

A computer program disclosed in the present specification is a computer program for processing a measurement result of a frequency characteristic measurement apparatus including a calibration unit configured to perform a SOLT calibration on cable end surfaces, a first measurement unit configured to measure S-parameters of a first substrate provided with a DUT, after the SOLT calibration by the calibration unit, and a second measurement unit configured to measure S-parameters of a second substrate after the SOLT calibration by the calibration unit, the computer program causing a computer to function as a first acquisition unit that acquires a measurement result of the first measurement unit, a second acquisition unit that acquires a measurement result of the second measurement unit, and an extraction unit configured to perform a vector operation of the measurement result of the first measurement unit and the measurement result of the second measurement unit to extract S-parameters of the DUT, in which the extraction unit assumes that a reflection of each of a first fixture and a second fixture, which are obtained by virtually dividing the second substrate into two parts at the center, on an end surface of the second substrate is equal to or smaller than a reflection on an end surface of the second substrate without the virtual division at the center, the first substrate includes at least one connector on each of a first end surface and a second end surface, the second substrate has a structure in which a part provided with the DUT is removed from the first substrate and two optional connectors are selected from among all of the connectors installed on the first substrate to form a through-connection, and the number of second substrates is a total number of combinations of selecting two connectors from among all of the connectors installed on the first substrate (sixth configuration).

According to the disclosure disclosed in the present specification, the frequency characteristics of the DUT can be conveniently measured at low cost.

DETAILED DESCRIPTION OF THE PREFERRED EMBODIMENT

Figure 1:
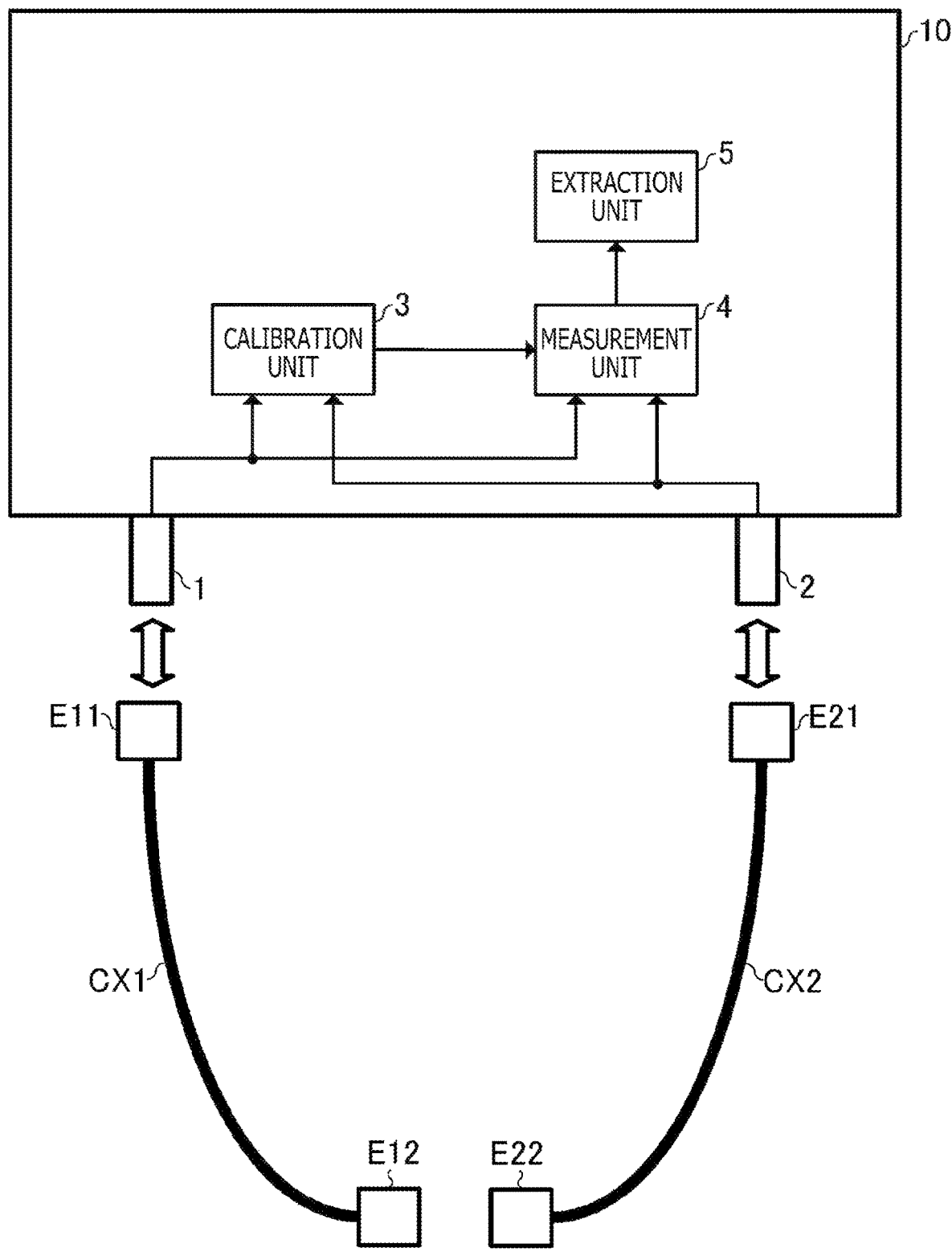
FIG. 1 is a block diagram illustrating a schematic configuration of a frequency characteristic measurement apparatus according to an embodiment.

FIG. 1 is a block diagram illustrating a schematic configuration of a frequency characteristic measurement apparatus according to an embodiment. A frequency characteristic measurement apparatus 10 according to the embodiment illustrated in FIG. 1 (hereinafter, abbreviated as a "frequency characteristic measurement apparatus 10") is a vector network analyzer.

The frequency characteristic measurement apparatus 10 includes a first port 1, a second port 2, a calibration unit 3, a measurement unit 4, and an extraction unit 5.

One end E11 of a first coaxial cable CX1 can be connected to the first port 1. One end E21 of a second coaxial cable CX2 can be connected to the second port 2.

The calibration unit 3 is configured to perform a SOLT calibration on cable end surfaces. Specifically, The one end E11 of the first coaxial cable CX1 is connected to the first port 1, and the one end E21 of the second coaxial cable CX2 is connected to the second port 2. In this state, the calibration unit 3 is configured to perform a SOLT calibration on each of an end surface of another end E12 of the first coaxial cable CX1 and an end surface of another end E22 of the second coaxial cable CX2. The SOLT calibration on the cable end surfaces is a well-known technique disclosed in, for example, Kotomi Ichikawa and Yuichi Ichikawa, "Detailed explanation of S-parameters for high frequency circuit design," fifth edition, CQ publishing Co., Ltd., Jan. 1, 2020, pp. 14 to 143, and the details will not be described here. The calibration unit 3 provides calibration results to the measurement unit 4.

The measurement unit 4 measures S-parameters. The measurement unit 4 functions as a first measurement unit and also functions as a second measurement unit.

The first measurement unit is configured to measure S-parameters of a first substrate SUB1 (see FIG. 2) provided with a DUT, after the SOLT calibration by the calibration unit 3. That is, the first substrate SUB1 is connected to the frequency characteristic measurement apparatus 10 through the first coaxial cable CX1 and the second coaxial cable CX2 when the first measurement unit executes the measurement.

The second measurement unit is configured to measure S-parameters of a second substrate SUB2 (see FIG. 3) having a structure in which the part provided with the DUT is removed from the first substrate SUB1, after the SOLT calibration by the calibration unit 3. That is, the second substrate SUB2 is connected to the frequency characteristic measurement apparatus 10 through the first coaxial cable CX1 and the second coaxial cable CX2 when the second measurement unit executes the measurement.

Figure 2:
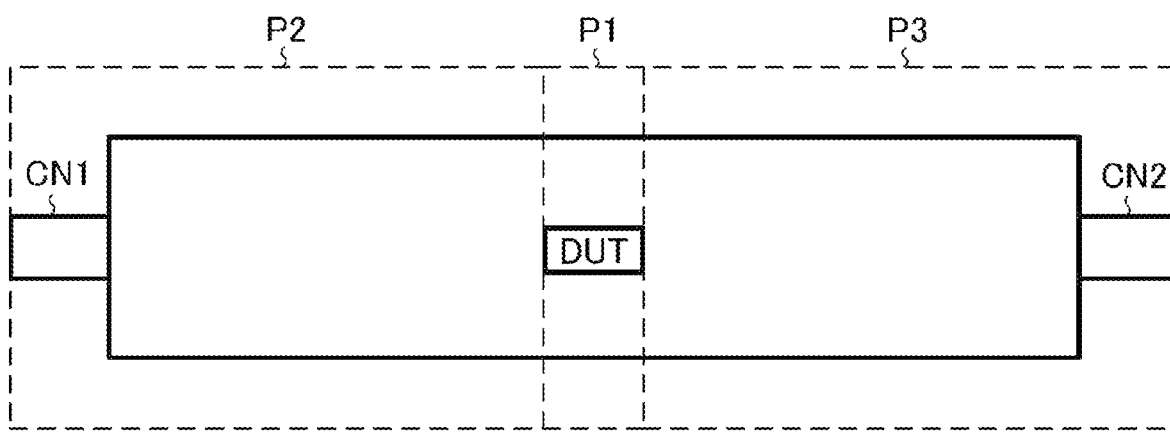
FIG. 2 is a schematic view illustrating a schematic structure of a first substrate.
Figure 3:
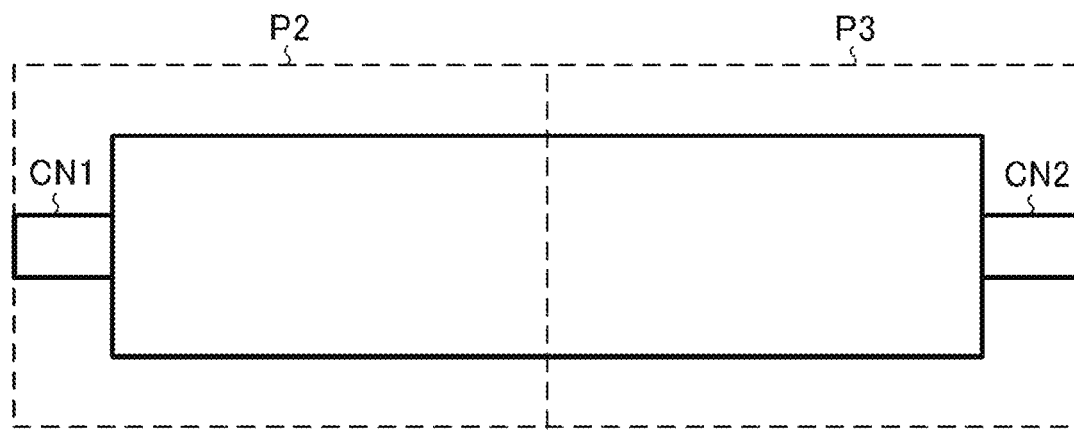
FIG. 3 is a schematic view illustrating a schematic structure of a second substrate.

FIG. 2 is a schematic view illustrating a schematic structure of the first substrate SUB1. FIG. 3 is a schematic view illustrating a schematic structure of the second substrate SUB2. The first substrate SUB1 includes a part P1 provided with a DUT, a first fixture P2, and a second fixture P3. The second substrate SUB2 includes the first fixture P2 and the second fixture P3. In the second substrate SUB2, the first fixture P2 and the second fixture P3 can be obtained by virtually dividing the second substrate SUB2 into two pieces at the center.

The first fixture P2 includes a first connector CN1 that can be connected to the other end E12 of the first coaxial cable CX1. The first connector CN1 is provided at a left end of the first fixture P2. The second fixture P3 includes a second connector CN2 that can be connected to the other end E22 of the second coaxial cable CX1. The second connector CN2 is provided at a right end of the second fixture P3. Note that the first fixture P2 and the second fixture P3 have structures bilaterally symmetrical to each other. However, the first fixture P2 and the second fixture P3 may not have structures completely bilaterally symmetrical to each other, and there can be some manufacturing variations.

The extraction unit 5 is configured to perform a vector operation of the measurement results of the first measurement unit and the measurement results of the second measurement unit to extract the S-parameters of the DUT. The extraction results of the extraction unit 5 may be stored in, for example, a portable storage medium that can be attached to and detached from the frequency characteristic measurement apparatus 10 or may be displayed on a display unit provided on the frequency characteristic measurement apparatus 10. The extraction results may be output to the outside of the frequency characteristic apparatus 10 through communication.

A computer program for processing the measurement results of the first measurement unit and the measurement results of the second measurement unit can be installed on a computer such as a microcomputer, for example, and the computer program can be executed to realize the extraction unit 5. Although the extraction unit 5 is built in the frequency characteristic measurement apparatus 10 in the present embodiment, a computer provided outside of the frequency characteristic measurement apparatus 10 may function as the extraction unit 5.

Figure 4:
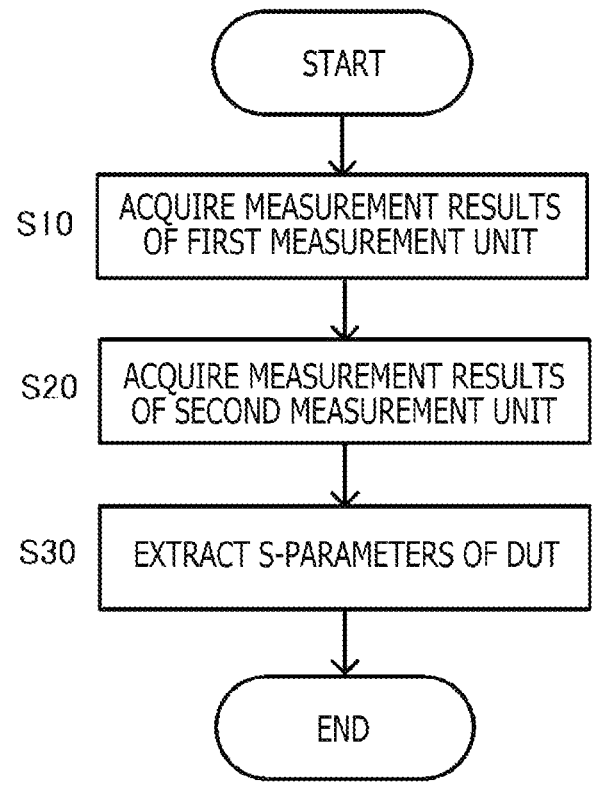
FIG. 4 is a flow chart illustrating an operation example of an extraction unit.

FIG. 4 is a flow chart illustrating an operation example of the extraction unit 5. The extraction unit 5 first acquires the measurement results of the first measurement unit (step S10). The extraction unit 5 then acquires the measurement results of the second measurement unit (step S20). Unlike in the present embodiment, step S20 may be executed first, and then step S10 may be executed. Step S10 and step S20 may be executed in parallel.

After acquiring the measurement results of the first measurement unit and the measurement results of the second measurement unit, the extraction unit 5 performs a vector operation of the measurement results of the first measurement unit and the measurement results of the second measurement unit to extract the S-parameters of the DUT (step S30) and ends the flow operation.

Figure 5:
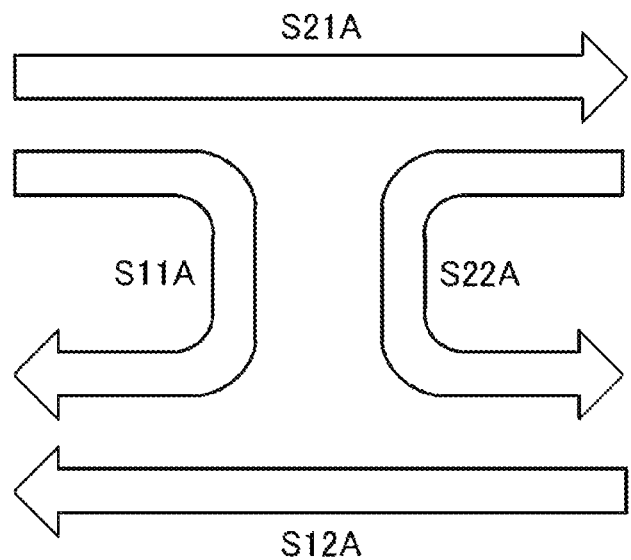
FIG. 5 schematically depicts S-parameters of a first fixture.
Figure 6:
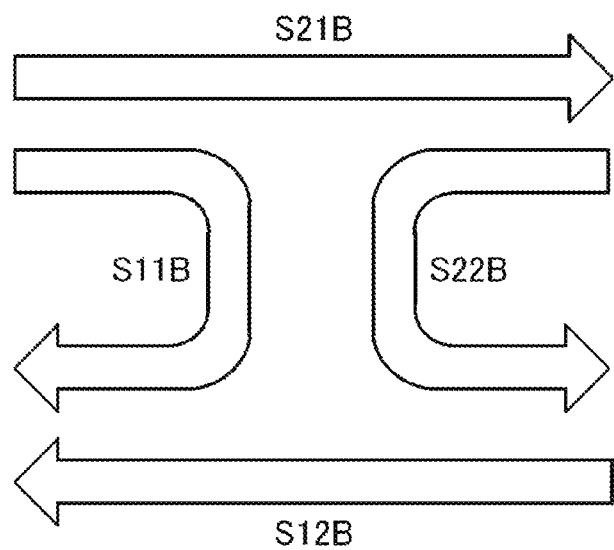
FIG. 6 schematically depicts S-parameters of a second fixture.
Figure 7:
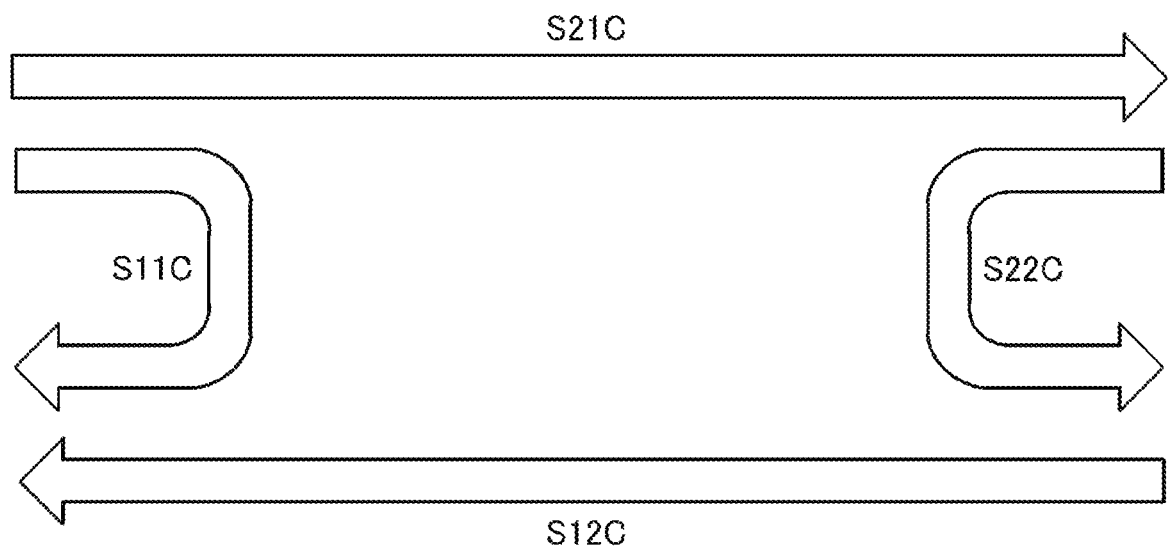
FIG. 7 schematically depicts S-parameters of the second substrate.

Details of the process of step S30 will be described. FIG. 5 schematically depicts S-parameters of the first fixture P2. FIG. 6 schematically depicts S-parameters of the second fixture P3. FIG. 7 schematically depicts S-parameters of the second substrate SUB2.

Because of the bilateral symmetry of the first fixture P2 and the second fixture P3, the extraction unit 5 sets S21A=S12B and S12A=S21B. The extraction unit 5 assumes that a reflection of each of the first fixture P2 and the second fixture P3 on an end surface of the second substrate is equal to or smaller than a reflection on an end surface of the second substrate SUB2 and does not assume that a reflection of each of the first fixture P2 and the second fixture P3 on a virtually divided surface is equal to or smaller than the reflection on the end surface of the second substrate SUB2. Note that, when the extraction unit 5 "assumes that a reflection of each of the first fixture P2 and the second fixture P3 on an end surface of the second substrate is equal to or smaller than a reflection on an end surface of the second substrate SUB2," it is only necessary that the extraction unit 5 can assume that the reflection of each of the first fixture P2 and the second fixture P3 on the end surface of the second substrate is mostly or completely equal to or smaller than the reflection on the end surface of the second substrate SUB2 in a frequency range of a measurement range. Therefore, this does not exclude a case in which the reflection of each of the first fixture P2 and the second fixture P3 on the end surface of the second substrate is partially higher than the reflection on the end surface of the second substrate SUB2 in the frequency range of the measurement range. The extraction unit 5 obtains the S-parameters of the first fixture P2 and the S-parameters of the second fixture P3 from the measurement results of the second measurement unit. Specifically, the S-parameters of the first fixture P2 and the S-parameters of the second fixture P3 are as follows.

(1) The amplitude of S11A (S-parameter indicating the reflection of the first fixture P2 on the end surface of the second substrate) is a single first fixed value throughout the entire frequency range of the measurement range.
(2) The phase of S11A is zero throughout the entire frequency range of the measurement range.
(3) $S22A=(S22C-S11A)/S12C$
(4) $S21A=(1-S11B^2 \times S21C)^{0.5}$
(5) $S12A=(1-S22A^2 \times S12C)^{0.5}$
(6) $S11B=(S11C-S11A)/S21C$
(7) The amplitude of S22B (S-parameter indicating the reflection of the second fixture P3 on the end surface of the second substrate) is the single first fixed value throughout the entire frequency range of the measurement range.
(8) The phase of S22B is zero throughout the entire frequency range of the measurement range.
(9) $S21B=S12A$
(10) $S12B=S21A$ The extraction unit 5 performs a vector operation to subtract the S-parameters of the first fixture P2 and the S-parameters of the second fixture P3 from the measurement results of the first measurement unit to obtain the S-parameters of only the DUT.

In the measurement using the frequency characteristic measurement apparatus 10, a short substrate is not necessary in place of the DUT, an open substrate is not necessary in place of the DUT, and a substrate provided with a load is not necessary in place of the DUT. Therefore, the frequency characteristic measurement apparatus 10 can conveniently measure the frequency characteristics of the DUT at low cost.

Assuming that the S-parameter S11A of the first fixture P2 is a value indicating a low reflection, an S-parameter S11 of the first substrate SUB1 is substantially determined by the S-parameter S11B of the second fixture P3 when the DUT has high transmission characteristics. On the other hand, the S-parameter S11 of the first substrate SUB1 is substantially determined by the S-parameter S11 of the DUT when the DUT has high reflection characteristics. Although two extreme cases including the case in which the DUT has high transmission characteristics and the case in which the DUT has high reflection characteristics have been described, the S-parameter S11 of the first substrate SUB1 is also substantially determined by the S-parameter S11B of the second fixture P3 and the S-parameter S11 of the DUT in other cases.

Similarly, assuming that the S-parameter S22B of the second fixture P3 is a value indicating a low reflection, an S-parameter S22 of the first substrate SUB1 is substantially determined by the S-parameter S22A of the first fixture P2 when the DUT has high transmission characteristics. On the other hand, the S-parameter S22 of the first substrate SUB1 is substantially determined by the S-parameter S22 of the DUT when the DUT has high reflection characteristics. Although two extreme cases including the case in which the DUT has high transmission characteristics and the case in which the DUT has high reflection characteristics have been described, the S-parameter S22 of the first substrate SUB1 is also substantially determined by the S-parameter S22A of the first fixture P2 and the S-parameter S22 of the DUT in other cases.

That is, it is reasonable for the extraction unit 5 to assume that the reflection of each of the first fixture P2 and the second fixture P3 on the end surface of the second substrate is equal to or smaller than a predetermined level throughout the entire frequency range of the measurement range.

Similar to the frequency characteristic measurement apparatus 10, a measurement apparatus that does not require a short substrate in place of the DUT, an open substrate in place of the DUT, and a substrate provided with a load in place of the DUT is disclosed in "Design criteria of automatic fixture removal (AFR) for asymmetric fixture de-embedding" (IEEE Conference Paper, p. 654 to p. 659, August 2014). However, it is presumed that the first fixture and the second fixture described in FIG. 2 of "Design criteria of automatic fixture removal (AFR) for asymmetric fixture de-embedding" (IEEE Conference Paper, p. 654 to p. 659, August 2014) cannot be appropriately virtually divided unless the distance between two end surfaces to be connected to the cables of the second substrate SUB2 is equal to or more than twice the reciprocal of the lowest frequency of the measurement range. On the other hand, in the frequency characteristic measurement apparatus 10, the distance between two end surfaces to be connected to the cables of the second substrate SUB2 does not have to be equal to or more than twice the reciprocal of the lowest frequency of the measurement range to obtain the S-parameters of (1) to (10). Therefore, it is preferable that the distance between two end surfaces to be connected to the cables of the second substrate SUB2 be less than twice the reciprocal of the lowest frequency of the measurement range from the viewpoint of reducing the size and reducing the cost of the second substrate SUB2.

Although the extraction unit 5 assumes that the transmission characteristics of the first fixture P2 and the transmission characteristics of the second fixture P3 are symmetrical in the embodiment, the extraction unit 5 may not assume that the transmission characteristics of the first fixture P2 and the transmission characteristics of the second fixture P3 are symmetrical. (9) above is changed to (9)' below, and (10) above is changed to (10)' below when the extraction unit 5 does not assume that the transmission characteristics of the first fixture P2 and the transmission characteristics of the second fixture P3 are symmetrical.

(9)' $S21B=(1-S11B^2 \times S21C)^{0.5}$ (10)' $S12B=(1-S22A^2 \times S12C)^{0.5}$ Although the first substrate SUB1 includes two connectors (first connector CN1 and second connector CN2) in the embodiment, the number of connectors installed on the first substrate SUB1 may be three or more.

That is, it is only necessary that the first substrate SUB1 include at least one connector on each of a first end surface and a second end surface. It is only necessary that the second substrate SUB2 has a structure in which the part provided with the DUT is removed from the first substrate SUB1, and two optional connectors are selected from among all of the connectors installed on the first substrate SUB1 to form a through-connection. Note that the number of second substrates SUB2 is a total number of combinations of selecting two connectors from among all of the connectors installed on the first substrate SUB1.

An example of a case in which the first substrate SUB1 includes four connectors (first to four connectors) will be illustrated to describe an overview of the measurement procedure.

The number of second substrates SUB2 is six ($=_4C_2$) when the first substrate SUB1 includes four connectors (first to fourth connectors).

A first second substrate SUB2 has a structure in which the part provided with the DUT is removed from the first substrate SUB1 and the first connector and the second connector installed on the first substrate SUB1 are used to form a through-connection.

A second second substrate SUB2 has a structure in which the part provided with the DUT is removed from the first substrate SUB1 and the first connector and the third connector installed on the first substrate SUB1 are used to form a through-connection.

A third second substrate SUB2 has a structure in which the part provided with the DUT is removed from the first substrate SUB1 and the first connector and the fourth connector installed on the first substrate SUB1 are used to form a through-connection.

A fourth second substrate SUB2 has a structure in which the part provided with the DUT is removed from the first substrate SUB1 and the second connector and the third connector installed on the first substrate SUB1 are used to form a through-connection.

A fifth second substrate SUB2 has a structure in which the part provided with the DUT is removed from the first substrate SUB1 and the second connector and the fourth connector installed on the first substrate SUB1 are used to form a through-connection.

A sixth second substrate SUB2 has a structure in which the part provided with the DUT is removed from the first substrate SUB1 and the third connector and the fourth connector installed on the first substrate SUB1 are used to form a through-connection.

As in the embodiment, each of the first to sixth second substrates SUB2 is virtually divided. The S-parameters of the first fixture and the S-parameters of the second fixture are obtained, and the S-parameters of the first fixture and the S-parameters of the second fixture are used to obtain the S-parameters of only the DUT.

The first second substrate SUB2 and the second second substrate SUB2 will be described here. The S-parameters of the first fixture in the first second substrate SUB2 are S11A, S12A, S21A, and S22A. The S-parameters of the second fixture in the first second substrate SUB2 are S11B, S12B, S21B, and S22B. The S-parameters of the first fixture in the second second substrate SUB2 are S11A, S31A, S13A, and S33A. The S-parameters of the second fixture in the second second substrate SUB2 are S11B, S31B, S13B, and S33B. Therefore, S11B is obtained from the first second substrate SUB2, and S11B is also obtained from the second second substrate SUB2.

In this way, the diagonal components of the S-parameters are duplicated. Therefore, a standard, such as a standard of adopting the diagonal component with the largest reflection among the duplicated diagonal components, for example, and a standard of averaging the duplicated diagonal components, for example, is provided. The value of each diagonal component is determined based on the standard.

Note that the value of each off-diagonal component may be calculated again after the value of each diagonal component is determined. A standard, such as a standard of adopting the value with the largest reflection after comparing the value of each off-diagonal component before recalculation and the value of each off-diagonal component after recalculation, for example, and a standard of averaging the values, for example, is provided, and the value of each off-diagonal component is ultimately determined based on the standard.

When the number of ports in the frequency characteristic measurement apparatus is larger than the number of connectors in the first substrate SUB1, unused ports in the frequency characteristic measurement apparatus can be terminated with 50Ω.

It is to be noted that the embodiment of the present disclosure is not limited to the foregoing embodiment, and that various changes can be made without departing from the spirit of the present disclosure.

What is claimed is:

1. A frequency characteristic measurement apparatus, comprising:
   a calibration circuit configured to perform a short-open-load-thru calibration on cable end surfaces;
   a first measurement circuit configured to measure a plurality of first S-parameters of a first substrate, after the short-open-load-thru calibration by the calibration circuit, wherein the first substrate includes a first fixture, a second fixture, and a device under test;
   a second measurement circuit configured to measure a plurality of second S-parameters of a second substrate after the short-open-load-thru calibration by the calibration circuit, wherein the second substrate includes the first fixture and the second fixture; and
   an extraction circuit configured to:
     set an amplitude of a S-parameter of a plurality of third S-parameters of the first fixture of the second substrate to a first fixed value throughout an entire frequency range of a measurement range;
     set a phase of the S-parameter of the plurality of third S-parameters to zero throughout the entire frequency range of the measurement range;
     determine a set of S-parameters of the plurality of third S-parameters based on each of:
       the set amplitude of the S-parameter of the plurality of third S-parameters, the set phase of the S-parameter of the plurality of third S-parameters, and the plurality of second S-parameters, wherein the plurality of third S-parameters includes the S-parameter and the set of S-parameters;

determine a plurality of fourth S-parameters of the second fixture of the second substrate based on each of:

the plurality of second S-parameters, and the plurality of third S-parameters; and perform a vector operation based on each of:

the plurality of first S-parameters, the plurality of third S-parameters, and the plurality of fourth S-parameters, wherein the vector operation is performed to extract a plurality of fifth S-parameters of the device under test, the extraction circuit assumes that a reflection of each of the first fixture of the second substrate and the second fixture of the second substrate, which are obtained by virtually dividing the second substrate into two parts at a center, on an end surface of the second substrate is equal to or smaller than a reflection on an end surface of the second substrate without the virtual division at the center, the first substrate further includes at least one connector on each of a first end surface and a second end surface, the second substrate has:

a structure in which a part provided with the device under test is removed from the first substrate, and two optional connectors that are selected from among all of connectors installed on the first substrate to form a through-connection, and a number of second substrates is a total number of combinations of selecting two connectors from among all of the connectors installed on the first substrate.

2. The frequency characteristic measurement apparatus according to claim 1, wherein the S-parameter of the plurality of third S-parameters indicates the reflection of the first fixture on the end surface of the second substrate, and the extraction circuit is further configured to:

set an amplitude of a S-parameter of the plurality of fourth S-parameters to the first fixed value throughout the entire frequency range of the measurement range, wherein the S-parameter of the plurality of fourth S-parameters indicates the reflection of the second fixture on the end surface of the second substrate; and set a phase of the S-parameter of the plurality of fourth S-parameters to zero throughout the entire frequency range of the measurement range.

3. The frequency characteristic measurement apparatus according to claim 1, wherein the extraction circuit assumes that transmission characteristics of the first fixture and transmission characteristics of the second fixture are symmetrical.

4. The frequency characteristic measurement apparatus according to claim 1, wherein the extraction circuit does not assume that transmission characteristics of the first fixture and transmission characteristics of the second fixture are symmetrical.

5. The frequency characteristic measurement apparatus according to claim 1, wherein a distance between two end surfaces of the second substrate is less than twice a reciprocal of a lowest frequency of the measurement range, and the two end surfaces of the second substrate are connected to cables.

6. A non-transitory computer-readable medium having stored thereon, computer-executable instructions which, when executed by a computer, cause the computer to execute operations, the operations comprising:

acquiring a measurement result of a first measurement circuit of a frequency characteristic measurement apparatus, wherein the frequency characteristic measurement apparatus includes:

a calibration circuit configured to perform a device under test calibration on cable end surfaces, the first measurement circuit configured to measure a plurality of first S-parameters of a first substrate after the device under test calibration by the calibration circuit, wherein the first substrate includes a first fixture, a second fixture, and a device under test, and a second measurement circuit configured to measure a plurality of second S-parameters of a second substrate after the device under test calibration by the calibration circuit, wherein the second substrate includes the first fixture and the second fixture;

acquiring a measurement result of the second measurement circuit;

setting an amplitude of a S-parameter of a plurality of third S-parameters of the first fixture of the second substrate to a first fixed value throughout an entire frequency range of a measurement range;

setting a phase of the S-parameter of the plurality of third S-parameters to zero throughout the entire frequency range of the measurement range;

determining a set of S-parameters of the plurality of third S-parameters based on each of:

the set amplitude of the S-parameter of the plurality of third S-parameters, the set phase of the S-parameter of the plurality of third S-parameters, and the plurality of second S-parameters, wherein the plurality of third S-parameters includes the S-parameter and the set of S-parameters;

determining a plurality of fourth S-parameters of the second fixture of the second substrate based on each of:

the plurality of second S-parameters, and the plurality of third S-parameters; and performing a vector operation based on each of:

the plurality of first S-parameters, the plurality of third S-parameters, and the plurality of fourth S-parameters, wherein the vector operation is performed to extract a plurality of fifth S-parameters of the device under test, a reflection of each of the first fixture of the second substrate and the second fixture of the second substrate, which are obtained by virtually dividing the second substrate into two parts at a center, on an end surface of the second substrate is assumed to be equal to or smaller than a reflection on an end surface of the second substrate without the virtual division at the center, the first substrate further includes at least one connector on each of a first end surface and a second end surface, the second substrate has:
- a structure in which a part provided with the device under test is removed from the first substrate, and
- two optional connectors that are selected from among all of connectors installed on the first substrate to form a through-connection, and a number of second substrates is a total number of combinations of selecting two connectors from among all of the connectors installed on the first substrate.

\* \* \* \* \*